United States Patent [19]

Woskow

[11] 4,055,816
[45] Oct. 25, 1977

[54] VOLTAGE STRESS STABILIZED SAW DEVICE

[75] Inventor: Robert M. Woskow, Canoga Park, Calif.

[73] Assignee: International Telephone and Telegraph Corporation, New York, N.Y.

[21] Appl. No.: 708,869

[22] Filed: July 26, 1976

[51] Int. Cl.$^2$ .......................... H03B 3/04; H03B 5/30
[52] U.S. Cl. ...................................... 331/32; 330/5.5; 331/1 R; 331/107 A; 332/26; 333/30 R; 333/72
[58] Field of Search ..................... 331/107 A, 1 R, 32; 330/5.5; 333/30 R, 72; 332/26

[56] References Cited

U.S. PATENT DOCUMENTS

| 3,921,093 | 11/1975 | Lewis | 331/107 A X |
| 3,936,765 | 2/1976 | Lewis et al. | 331/107 A X |
| 3,979,697 | 9/1976 | Donahue | 331/107 A |

Primary Examiner—Siegfried H. Grimm
Attorney, Agent, or Firm—William T. O'Neil

[57] ABSTRACT

An oscillator or similar device employing a frequency setting SAW element having a piezoelectric substrate and an arrangement of interdigital finger transducers mounted thereon. In one embodiment, two interdigital finger transducers provide surface acoustic wave launching and reception respectively and in another embodiment, two additional transducers form a part of a discriminator circuit. Phase detection either between the electrical connections of the launching and receiving transducers or through the discriminator arrangement generates a feedback control signal which is applied across the ends of the substrate as a stress-controlling signal in a manner to compensate for temperature and other environmental factors which otherwise change the frequency of oscillation.

10 Claims, 2 Drawing Figures

VOLTAGE STRESS STABILIZED SAW DEVICE

BACKGROUND OF THE INVENTION

1. Field of the Invention

The invention relates to SAW (Surface Accoustical Wave) devices generally and more particularly to arrangements for stabilization of such devices.

2. Description of the Prior Art

In the prior art, the so-called SAW devices have found a number of uses. Basically, those devices rely on the generation and detection of surface acoustic waves, also known as RAYLEIGH waves, in a piezoelectric material. Although the piezoelectric phenomenon has been known and used to provide stable signal delay filters and oscillators, the exploitation of the effect had, until comparatively recently, been largely confined to so-called bulk wave applications.

Relatively recently however, the refinement of photo lithographic processing (photoetch techniques) particularly as applied to microcircuits, has made possible the SAW interdigital transducer. Such devices have been described in the technical and patent literature, for example, in U.S. patent application Ser. No. 493,673, filed Aug. 1, 1974, (now U.S. Pat. No. 3,979,700, entitled: "Video Processor". That U.S. patent application describes the application of SAW technology to a particular type of video processing and is assigned to the assignee of the present application.

A more directly pertinent prior art document, in that it relates to SAW oscillators specifically, is the technical paper entitled: "The Surface Acoustic Wave Oscillator — A Natural and Timely Development of the Quartz Crystal Oscillator", by Meirion Lewis of the Royal Radar Establishment, Malvern, Worcs., UK. That paper was published in the Proceedings of the 28th Annual Symposium on Frequency Control, May 1974, and is distributed by the National Technical Information Service of the U.S. Department of Commerce.

In the aforementioned technical paper, the use of the SAW transducer as the feedback element in an oscillator is shown. The paper also suggests ways of producing frequency control or frequency modulation of the SAW oscillator. The relative difficulty of effecting frequency modulation of such a device can be appreciated in view of the several circuit approaches suggested by Lewis. These approaches include incorporation of a phase shift network in the amplifier circuit of the oscillator loop, use of varactors in a phase shift network, etc.

Piezoelectric devices, and particularly oscillators employing piezoelectric elements, are noted for their relatively high order of stability, and the same benefits accrue to SAW oscillators of the type to which the present invention applies, as generally applied to bulk effect devices. By bulk effect devices, in this case, it is intended to refer to the crystal oscillator of the type well known and widely used in the radio arts for many decades of time.

It will be realized that the introduction of other circuit elements, such as varactors, etc., must inherently deteriorate the stability advantages employed by unmodulated SAW oscillators, because the frequency determination function is partly usurped from the piezoelectric element. Moreover, the additional complication tends to tarnish the attractiveness of the SAW oscillator, which is inherently a very inexpensive and highly satisfactory device capable of being efficiently manufactured in sizes compatible with micro-circuitry.

Still further, U.S. patent application Ser. No. 628,082 filed Nov. 3, 1975, (now U.S. Pat. No. 3,979,697) and titled, "Frequency Modulated SAW Oscillator", also assigned to the assignee of the present application, introduces a technique for altering the frequency of a SAW oscillator by applying a voltage signal end-to-end on the piezoelectric substrate thereby having an effect on the physical length of the said substrate in the direction of propagation of the SAW waves thereon. The frequency control provided in that device is also incorporated into the present device in combination with a unique arrangement for doubly exploiting the characteristics of the piezoelectric substrate to provide greatly improved stability.

In the hereinbefore identified technical paper by Meirion Lewis, an oscillator configuration is described with phase shift compensation substantially only for phase shift in the amplifier which, in combination with the SAW device, operates as an oscillator. The configuration suggested by Lewis requires very accurate placement of the interdigital finger transducers to a precise quarterwavelength offset. The device is moreover, relatively lossy due to the split transducer-PIN diode configuration, and is relatively sensitive to amplifier variations. Those factors tend to further degrade the obtainable performance and stability obtainable in this typical prior art device.

The manner in which the present invention alleviates the problems extant in the prior art by providing a simple, low-cost and efficient SAW circuit, particularly described as an oscillator, but nevertheless adaptable in other SAW circuitry, will be evident as this description proceeds.

SUMMARY

It may be said to have been the general object of the present invention to provide an improved circuit and apparatus arrangement for stabilizing SAW devices in general, and in particular for frequency stabilizing a SAW oscillator. The invention is described in the form of a voltage-stress stabilized oscillator, however, once the principles of the present invention are well-understood, it will be apparent that the concept of voltage-stressing the piezoelectric substrate with a gradient in the direction of the surface of the acoustic wave, in combination with circuit means for sensing environmentally induced changes measurable in terms of circuit performance parameters, is also adaptable in SAW filters, delay lines, etc.

The arrangement according to the invention eliminates the need for the double transducers, PIN diode switching circuitry, and other complexities tending to increase the cost of the photomask used in applying the interdigital fingers to the substrate in the prior art stabilized oscillator approach such as described in the aforementioned Meirion Lewis paper. In accordance with the stabilization approach provided by the present invention, a simple, relatively inexpensive and effective stabilized oscillator or other SAW device can be constructed.

The invention, described as an oscillator arrangement, basically comprises two elements, i.e., the SAW device itself, and a reasonably stable amplifier connected with the SAW device in a feedback loop. On the piezoelectric substrate, a surface wave launching transducer at one end and a receiving transducer at the other end, both in the form of interdigital finger arrangements, provide the terminals of the SAW device which are connected to the input and output of the oscillator amplifier in a more or less conventional way. These terminals are, in addition, fed to a phase detector which detects even relatively small variations in the phase relationship between these amplifier input and output terminals as a result of environmentally induced variations in the SAW device. A control signal is thereby developed to apply a voltage induced stress from end-to-end of the substrate in a compensating sense. Since the SAW device is basically an electro-acoustical ultrasonic device, the mechanical length of the substrate varies as a result of temperature and other environmental factors, this variation inducing an oscillator frequency change. The oscillator center frequency is basically determined by the finger spacing of the launching and receiving transducers whereas the relatively longer spacing between these transducers may contain many wave lengths at the oscillator frequency such that variation of this relatively longer substrate dimension between the input and output transducers provides a relatively magnified phase change, which when detected by the aforementioned phase detector provides a sensitive basis for generation of the voltage-stress signal.

The details of the manner in which a typical embodiment according to the present invention, and one variation thereof, may be constructed will be evident as this description proceeds.

DESCRIPTION OF THE PREFERRED EMBODIMENTS

Figure 1:
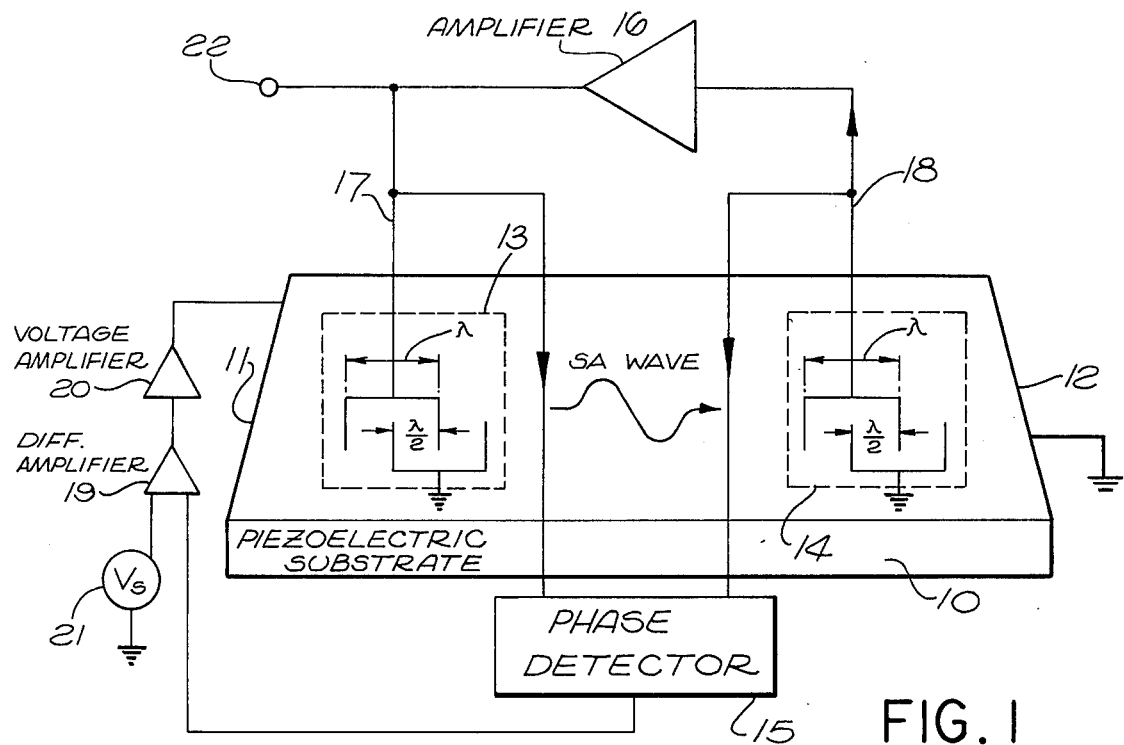
FIG. 1 is a schematic block diagram of an oscillator according to the invention employing a phase detector as an error sensing device across the terminals of the SAW device.

Referring now to FIG. 1, an embodiment according to the present invention shows a piezoelectric substrate 10, of a suitable quartz material for example, preferably in a generally rectangular shape. Conductive end-face electrodes or layers 11 and 12 provide for application of the stress-inducing control voltage, which operates to deform (more or less) the substrate in the length dimension, i.e., in the direction of propagation of the surface acoustic wave.

The manner of application of the electrodes 11 and 12 is known in this art and is essentially the same as described in the aforementioned U.S. Pat. No. 3,979,697.

Figure 2:
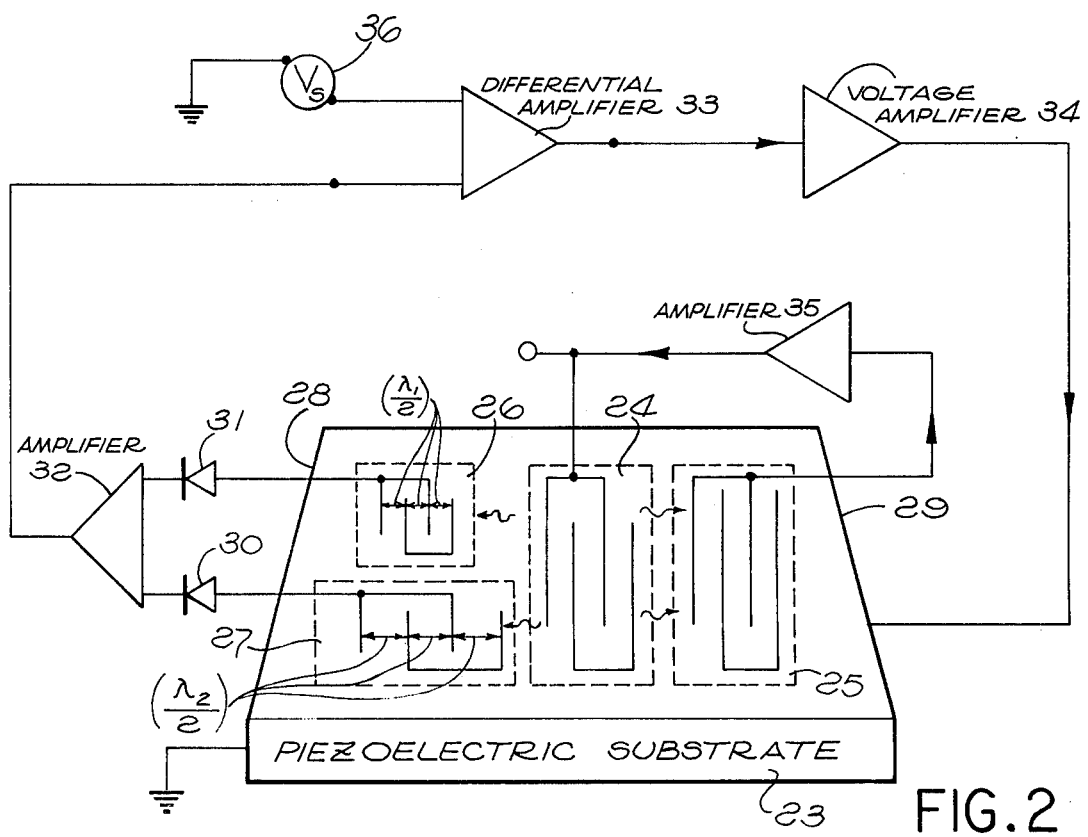
FIG. 2 is a second embodiment of an SAW oscillator in accordance with the invention in which the error sensing is accomplished by a pair of interdigital electrodes transducers having frequency finger spacings braketing the center frequency of the oscillator, in combination with discriminator circuitry for generating the error signal.

The input and output transducers in FIG. 1 are 13 and 14 respectively, these being applied as interdigital finger electrodes according to processes well known and understood in the art respecting SAW devices. Each of these transducers has upper and lower finger pairs as shown, symetrically interleaved with one wavelength spacing between adjacent upper pair or lower pair fingers. The upper and lower finger pairs are staggered one-half wavelength, right to left as depicted on FIG. 1. It is this spacing arrangement which basically determines the frequency of oscillation. The surface wave thereby launched by the input transducer 13 propagates (to the right as seen on FIG. 1) to be intercepted and reconverted to an electrical quantity by the receiving transducer 14, which is arranged substantially identically in respect to geometry and spacing as is transducer 13. The illustration of the FIG. 1, and for that matter FIG. 2, are, of course, greatly exaggerated. The actual physical spacings corresponding to one-half wavelength amount to only about 0.2 mils for an oscillation frequency on the order of 300 $MH_z$.

From the foregoing it will be realized that the spacing from transducer 13 to 14 may be hundreds (or even thousands) of wave lengths. This tends to amplify greatly any phase change caused by temperature or other environmental effect tending to change the length of the substrate 10.

The basic oscillator circuit of FIG. 1 comprises then, the transducers 13 and 14 on the substrate 10, with the feedback path 18 passing through amplifier 16 and back to 13 via lead 17. The feedback is, of course, regenerative and the entire SAW device thereby provides a tank circuit combined with a gainful feedback path. Terminal 22 represents an output connection for the device.

If it is assumed that a change begins to occur in the length of the substrate 10 due to temperature, for example, a phase change many times greater than that exhibited between interdigital fingers within the input and output transducers occurs between 13 and 14. This phase change is manifest electrically between leads 17 and 18 which connect to the phase detector 15, the latter generating an error signal as a function of the aforementioned relative phase change between 17 and 18. After suitable amplification, this error signal is applied in the correct sense between electrodes 11 and 12 to introduce a compensatory stress-induced physical dimensional change in the substrate 10. The differential amplifier 19 is shown in FIG. 1 so that a reference or initial adjustment bias may be applied by a source $V_s$ at 21. Accordingly, the output of 19 provides a composite signal comprised of the output of 15 and 21 and that composite signal drives the voltage amplifier 20. A relatively large voltage signal is required in order to produce the desired compensatory effect end-to-end throughout the substrate 10.

It will be immediately realized at this point that the source 21 can actually be a frequency modulator causing the output at 22 to be a frequency modulated signal without interfering with the inherent regulatory feature of the device as hereinabove described.

Referring now to FIG. 2, many of the same elements present in FIG. 1 will be recognized. The substrate 23 may be the same as 10 and the transducers 24 and 25 compare directly to 13 and 14. The amplifier 35 is the basic amplifier of the oscillator feedback loop, comparable to 16, while 34 compares to 20, 33 to 19, and source 36 will be seen to be the same as 21. The functions of these comparable elements are identical with those as described in connection with FIG. 1.

Quite obviously, the surface wave launching transducer 24 in the configuration of FIG. 2 will radiate the surface wave both to the right toward the receiving transducer 25 and to the left toward a pair of auxiliary transducers 26 and 27 illustrated in FIG. 2. Transducers 26 and 27 have interdigital spacings of $\lambda_1$ and $\lambda_2$ respectively. These wave lengths $\lambda_1$ and $\lambda_2$ correspond to symmetrically placed frequencies on either side of the oscillator center frequency and each feeds a detector or rectifier 31 and 30 respectively. A differential amplifier 32 responsive to the outputs of 30 and 31 can then provide an amplified output signal which is at 0 or some nominal value corresponding to the desired center frequency, but capable of varying in both senses. In this way a phase detection action over the relatively long surface wave path length between transducer 24 and the 26 and 27 transducer pair is provided analagous to the described situation in respect to FIG. 1. Ordinarily, in a configuration such as FIG. 2, the spacing between transducers 24 and 25 would be smaller than between 24 and 26/27 pair. The voltage amplifier 34 quite obviously operates to provide the stress-inducing voltage between substrate end faces 29 and 28 in the proper sense to counteract the drift or instability changes occurring.

It will be realized that, as a matter of design, where only minimal correction voltages are required the output of 15 in FIG. 1 might be applied directly to electrode 11. Similarly, the output of 32 might be directly applied to 29 for such minimum correction situations in respect to FIG. 2. In any event, the source 21 or 36 may be thought of as applying at all times a voltage, keeping the crystal stressed by a factor of S so that any corrective signal $\Delta c$ generated by the phase detector or discriminator will result in a crystal stress state of $S \pm \Delta c$. Crystal stress variation in both directions from the steady state stress S thereby provides for correction in either direction or sense.

Quite obviously, the replacement of $V_s$ with a source of pre-programmed levels can result in the production of a corresponding program of frequencies causing the device of either FIG. 1 or FIG. 2 to operate as a frequency synthesizer. Basically, the stabilization described herein is also applicable to SAW devices other than oscillators, so long as a relative phase or frequency may be sensed and used as a crystal stressing control signal.

Other modifications and variations on the specific instrumentation will suggest themselves to those skilled in this art, once the principles of the present invention are fully understood. Accordingly, it is not intended that the drawing or this description should be regarded as limiting the scope of the invention, these being typical and illustrative only.

I claim:

1. A device such as an oscillator, having a surface acoustic wave frequency determining element, comprising:
   a substrate of piezoelectric material having a planar surface;
   first and second transducers each having interleaved interdigital finger transducers affixed to said planar surface for launching and receiving surface acoustic waves on said planar surface, respectively;
   phase detecting means connected to monitor said surface acoustic waves and to generate a control signal as a function of a change of wavelength of said acoustic waves on said planar surface;
   and means for applying said control signal as a stress-inducing signal producing a potential gradient within said substrate in the direction of propagation of said surface waves, said control signal being applied in a sense tending to compensate for said changes of wavelength of said acoustic waves.

2. Apparatus according to claim 1 further including a gain element connected to provide positive feedback between said first and second transducers, said device thereby operating as a frequency stabilized oscillator.

3. Apparatus according to claim 1 further including a differential amplifier having as its output, said stress-inducing signal and responsive on one of its inputs to said control signal generated by said phase detecting means and on its other input to a separate signal for independently modifying at least the steady state level of said stress-inducing signal, said stress-inducing signal thereby controlling the frequency of said oscillator for frequency stabilization and for independent frequency variation.

4. Apparatus according to claim 2 further including a differential amplifier providing said stress-inducing signal at its output and being responsive on one of its inputs to said control signal generated by said phase detecting means and on its other input to a separate signal for independently modifying at least the steady state level of said stress-inducing signal, said stress-inducing signal thereby controlling the frequency of said oscillator for frequency stabilization and for independent frequency variation.

5. Apparatus according to claim 1 in which said means for applying said control signal as a stress-inducing signal includes first and second conductive electrode panels, said first panel being affixed to a first end of said substrate and said second panel being affixed to a second end of said substrate opposite of said first end, said first and second ends defining the dimension of said planar surface substantially corresponding to the direction of propagation of said surface acoustic waves.

6. Apparatus according to claim 5 including a voltage amplifier responsive to the output of said phase detecting means for providing and applying said stress-inducing signal as a relatively high voltage signal effective between said first and second conductive electrode panels.

7. Apparatus according to claim 6 further including a gain element connected to provide positive feedback between said first and second transducers, said device thereby operating as a frequency stabilized oscillator.

8. Apparatus according to claim 1 in which said second transducer is located in spaced relationship on a first side of said first transducer and in which a pair of auxiliary sensing transducers are located in spaced relationship on a second side of said first transducer opposite said first side, said auxiliary transducer pair comprising third and fourth interdigital transducers having finger spacings less than and greater than the finger spacing of said first and second transducers, respectively, and including circuits connected to said third and fourth transducers to form a discriminator to provide said phase detecting means.

9. Apparatus according to claim 5 in which said second transducer is located in spaced relationship on a first side of said first transducer and in which a pair of auxiliary sensing transducers are located in spaced relationship on a second side of said first transducer opposite said first side, said auxiliary transducer pair comprising third and fourth interdigital transducers having finger spacings less than and greater than the finger spacing of said first and second transducers, respectively, and including circuits connected to said third and fourth transducers to form a discriminator to provide said phase detecting means.

10. Apparatus according to claim 8 further including a gain element connected to provide positive feedback between said first and second transducers, said device thereby operating as a frequency stabilized oscillator.

* * * * *